(12) United States Patent
Kugler et al.

(10) Patent No.: US 9,054,328 B2
(45) Date of Patent: Jun. 9, 2015

(54) PROCESS FOR CONTROLLING THE ACCEPTOR STRENGTH OF SOLUTION-PROCESSED TRANSITION METAL OXIDES FOR OLED APPLICATIONS

(75) Inventors: Thomas Kugler, Cambridge (GB); Richard J. Wilson, Cambridge (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 0 days.

(21) Appl. No.: 14/129,275

(22) PCT Filed: Jun. 21, 2012

(86) PCT No.: PCT/GB2012/000544
§ 371 (c)(1),
(2), (4) Date: Dec. 24, 2013

(87) PCT Pub. No.: WO2012/175925
PCT Pub. Date: Dec. 27, 2012

(65) Prior Publication Data
US 2014/0138660 A1    May 22, 2014

(30) Foreign Application Priority Data

Jun. 24, 2011   (GB) .................................. 1110770.3

(51) Int. Cl.
*H01L 29/08*    (2006.01)
*H01L 51/50*    (2006.01)
(Continued)

(52) U.S. Cl.
CPC ......... *H01L 51/5004* (2013.01); *H01L 51/5064* (2013.01); *H01L 51/5088* (2013.01); *H01L 51/0042* (2013.01); *H01L 51/5215* (2013.01)

(58) Field of Classification Search
None
See application file for complete search history.

(56) References Cited

U.S. PATENT DOCUMENTS

| 4,539,507 A | 9/1985 | VanSlyke et al. |
| 5,512,654 A | 4/1996 | Holmes et al. |

(Continued)

FOREIGN PATENT DOCUMENTS

| EP | 0 712 171 A1 | 5/1996 |
| EP | 0 850 960 A1 | 7/1998 |

(Continued)

OTHER PUBLICATIONS

Bacher et al., "Synthesis and Characterization of Photo-Cross-Linkable Hole-Conducting Polymers," *Macromolecules*, 38(5):1640-1647 (2005).

(Continued)

*Primary Examiner* — Kyoung Lee
(74) *Attorney, Agent, or Firm* — Marshall, Gerstein & Borun LLP

(57) ABSTRACT

The present invention provides a process for the adjustment of the electron acceptor strength of a transition metal oxide (TMO) to the HOMO of a semiconducting hole transport layer material (HTL material) in a device comprising an anode, a layer of said TMO deposited on said anode and a layer of said HTL material deposited on said TMO layer, comprising: depositing a solution comprising a precursor for said TMO on said anode, wherein the precursor solution has a pH selected so that the acceptor strength of the TMO for which the solution is a precursor is adjusted to the HOMO of said HTL material; drying the deposited solution to form a solid layer precursor layer; depositing a solution of said HTL material onto said solid layer precursor layer; and annealing thermally the resulting product to give the desired device having TMO at the interface between said anode and said HTL.

22 Claims, 6 Drawing Sheets

(51) Int. Cl.
*H01L 51/52* (2006.01)
*H01L 51/00* (2006.01)

(56) References Cited

U.S. PATENT DOCUMENTS

| | | | |
|---|---|---|---|
| 6,593,450 | B2 | 7/2003 | Woo et al. |
| 2010/0033086 | A1 | 2/2010 | Mikami et al. |
| 2011/0006294 | A1 | 1/2011 | Tanaka et al. |
| 2011/0095678 | A1* | 4/2011 | Ogita et al. .................. 313/504 |
| 2011/0127517 | A1 | 6/2011 | Nakatani |

FOREIGN PATENT DOCUMENTS

| | | |
|---|---|---|
| EP | 0 851 017 A1 | 7/1998 |
| EP | 1 009 045 A2 | 6/2000 |
| EP | 1 022 789 A2 | 7/2000 |
| EP | 1 030 539 A1 | 8/2000 |
| EP | 1 041 654 A1 | 10/2000 |
| EP | 2 178 132 A1 | 4/2010 |
| FR | 2 736 061 A1 | 1/1997 |
| FR | 2 785 615 A1 | 5/2000 |
| WO | WO-90/13148 A1 | 11/1990 |
| WO | WO-95/06400 A1 | 3/1995 |
| WO | WO-99/48160 A1 | 9/1999 |
| WO | WO-99/65961 A1 | 12/1999 |
| WO | WO-00/02936 A1 | 1/2000 |
| WO | WO-00/55927 A1 | 9/2000 |
| WO | WO-02/092723 A1 | 11/2002 |
| WO | WO-2005/074329 A1 | 8/2005 |
| WO | WO-2006/096399 A2 | 9/2006 |
| WO | WO-2006/109083 A1 | 10/2006 |
| WO | WO-2006/123741 A1 | 11/2006 |
| WO | WO-2008/016090 A1 | 2/2008 |
| WO | WO-2008/038747 A1 | 4/2008 |
| WO | WO-2008/111658 A1 | 9/2008 |
| WO | WO-2009/066061 | 5/2009 |
| WO | WO-2009/110642 A1 | 9/2009 |
| WO | WO-2010/013723 | 1/2010 |
| WO | WO-2010/013724 A1 | 2/2010 |

OTHER PUBLICATIONS

Bernius et al., "Progress with Light-Emitting Polymers," *Adv. Mat.*, 12(23):1737-1750 (2000).

Bharathan et al., "Polymer Electroluminescent Devices Processed by Inkjet Printing: I. Polymer Light-Emitting Logo," *Appl. Phys. Lett.*, 72:2660-2662 (1998).

Bolink et al., "Inverted Solution Processable OLEDs Using a Metal Oxide as an Electron Injection Contact," *Adv. Funct Mater.*, 18:145-150 (2008).

Bubniene et al., "Synthesis of New Hole-Transporting Molecular Glass with Pendant Carbazolyl Moieties," *Synthetic Metals*, 158(16):670-675 (2008).

Chang et al., "Dual-Color Polymer Light-Emitting Pixels Processed by Hybrid Inkjet Printing," *Appl. Phys. Lett.*, 73:2561-2563 (1998).

Chen et al., "Effective Connecting Architecture for Tandem Organic Light-Emitting Devices," *Appl. Phys. Lett.*, 87(24):241121-241123 (2005).

Grice et al., "High Brightness and Efficiency Blue Light-Emitting Polymer Diodes," *Appl. Phys. Lett.*, 73:629-631 (1998).

Hebner et al., "Ink-Jet Printing of Doped Polymers for Organic Light Emitting Devices," *Appl. Phys. Lett.*, 72(5):519-521 (1998).

Huang et al., "Crosslinkable Hole-Transporting Materials for Solution Processed Polymer Light-Emitting Diodes," *J. Mat. Chem.*, 18:4495-4509 (2008).

Inagi et al., "Functional Polymers Based on Electron-Donating TTF and Derivatives," *J. Mat. Chem.*, 17:4122-4135 (2007).

Jin et al., "Synthesis and Properties of PCPP-Based Conjugated Polymers Containing Pendant Carbazole Units for LEDs," *Bull. Korean Chem. Soc.*, 28(12):2419-2425 (2007).

Kageyama et al., "Hole-Transporting and Emitting Pendant Polymers for Organic Electroluminescent Devices," *Proc. of SPIE*, 6333 (2006).

Kanai et al., "Electronic Structure of Anode Interface with Molybdenum Oxide Buffer Layer," *Organic Electronics*, 11 (2):188-194 (2010).

Kim et al., "Synthesis and Luminescence Properties of poly(p-phenylenevinylene) Derivatives Carrying Directly Attached Carbazole Pendants," *J. Mater. Chem.*, 11:3023-3030 (2001).

Liu, "Efficient Polymer Photovoltaic Cells Using Solution-Processed $MoO_3$ an Anode Buffer Layer," *Solar Energy Materials and Solar Cells*, 94(5):842-845 (2010).

Meyer et al., "$MoO_3$ Films Spin-Coated from a Nanoparticle Suspension for Efficient Hole-Injection in Organic Electronics," *Adv. Mater.*, 23(1):70-73 (2011).

Nawa et al., "Polymers Containing Pendant Oligothiophenes as a Novel Class of Electrochromic Materials," *J. Mat. Chem.*, 3(1):113-114 (1993).

Nawa et al., "Synthesis of a Novel Type of Electrochemically Doped Vinyl Polymer Containing Pendant Terthiophene and Its Electrical and Electrochromic Properties," *Macromolecules*, 28(3):723-729 (1995).

Niu et al., "Thermally Crosslinked Hole-Transporting Layers for Cascade Hole-Injection and Effective Electron-Blocking/Exciton-Confinement in Phosphorescent Polymer Light-Emitting Diodes," *Appl. Phys. Lett.*, 88:093505-093507 (2006).

Service, "Self-Assembled LEDs Shine Brightly," *Science*, 279(5354):1135 (1998).

Shao et al., "Long-Lifetime Polymer Light-Emitting Electrochemical Cells Fabricated with Crosslinked Hole-Transport Layers," *Adv. Mater.*, 21:1972-1975 (2009).

Sugiyama et al., "Living Anionic Polymerization of Styrene Derivatives para-Substituted with π- Conjugated Oligo(fluorene) Moieties," *Macromolecules*, 42(12):4053-4062 (2009).

Tokito et al., "Metal Oxides as a Hole-Injecting Layer for an Organic Electroluminescent Device," *J. Phys. D. Appl. Phys.*, 29(11):2750-2753 (1996).

Yook et al., "Low Driving Voltage in Organic Light-Emitting Diodes Using $MoO_3$ as an Interlayer in Hole Transport Layer," *Synth. Met.*, 159(1-2):69-71 (2009).

Zach et al., "Synthesis of Molybdenum Nanowires with Millimeter-Scale Lengths Using Electrochemical Step Edge Decoration," *Chem. Mater.*, 14(7):3206-3216 (2002).

International Preliminary Report on Patentability for Application No. PCT/GB2012/000544, dated Dec. 24, 2013.

International Search Report and Written Opinion for Application No. PCT/GB2012/000544, dated Sep. 28, 2012.

* cited by examiner

PROCESS FOR CONTROLLING THE ACCEPTOR STRENGTH OF SOLUTION-PROCESSED TRANSITION METAL OXIDES FOR OLED APPLICATIONS

FIELD OF INVENTION

The present invention provides a process for tailoring the acceptor strength in solution-deposited transition metal oxides such as molybdenum trioxide by the choice of the transition metal oxide precursor materials thus allowing the control of the extent of doping (i.e. the doping profile) in devices comprising composite Hole Injection Layers (HILs) which comprise solution-deposited transition metal oxides in combination with a layer of hole-transporting polymer.

BACKGROUND TO THE INVENTION

There has been considerable interest in light emitting organic materials such as conjugated polymers for a number of years. Light emitting polymers possess a delocalised pi-electron system along the polymer backbone. The delocalised pi-electron system confers semiconducting properties to the polymer and gives it the ability to support positive and negative charge carriers with high mobilities along the polymer chain.

Thin films of these conjugated polymers can be used in the preparation of optical devices such as light-emitting devices. These devices have numerous advantages over devices prepared using conventional semiconducting materials, including the possibility of wide area displays, low DC working voltages and simplicity of manufacture. Devices of this type are described in, for example, WO-A-90/13148, U.S. Pat. No. 5,512,654 and WO-A-95/06400.

Great efforts have been dedicated to the realization of a full-colour, all plastic screen. The major challenges to achieve this goal are: (1) access to conjugated polymers emitting light of the three basic colours red, green and blue; and (2) the conjugated polymers must be easy to process and fabricate into full-colour display structures. OLEDs are effective in meeting the first requirement, since manipulation of the emission colour can be achieved by changing the chemical structure of the organic emissive compound.

However, while modulation of the chemical nature of the emissive layer is often relatively easy and inexpensive on the lab scale it can be an expensive and complicated process on the industrial scale. The second requirement of the easy processability and build-up of full colour matrix devices raises the question of how to micro-pattern fine multicolour pixels and how to achieve full-colour emission. Inkjet printing, hybrid inkjet printing technology and spin coating are examples of suitable technologies that can be adopted to apply the polymer solutions in the desired pattern.

At their most basic, organic electroluminescent devices generally comprise an organic light emitting material which is positioned between a hole injecting electrode and an electron injecting electrode. The hole injecting electrode (anode) is typically a transparent tin-doped indium oxide (ITO)-coated glass substrate. The material commonly used for the electron injecting electrode (cathode) is a low work function metal such as calcium or aluminium.

The materials that are commonly used for the organic light emitting layer include conjugated polymers such as poly-phenylene-vinylene (PPV) and derivatives thereof (see, for example, WO-A-90/13148), polyfluorene derivatives (see, for example, A. W. Grice, D. D. C. Bradley, M. T. Bernius, M. Inbasekaran, W. W. Wu, and E. P. Woo, Appl. Phys. Lett. 1998, 73, 629, WO-A-00/55927 and Bernius et al., Adv. Materials, 2000, 12, No. 23, 1737), polynaphthylene derivatives and polyphenanthrenyl derivatives; and small organic molecules such as aluminium quinolinol complexes (Alq3 complexes: see, for example U.S. Pat. No. 4,539,507) and quinacridone, rubrene and styryl dyes (see, for example, JP-A-264692/1988). The organic light emitting layer can comprise mixtures or discrete layers of two or more different emissive organic materials.

Typical device architectures are disclosed in, for example, WO-A-90/13148; U.S. Pat. No. 5,512,654; WO-A-95/06400; R. F. Service, Science 1998, 279, 1135; Wudl et al., Appl. Phys. Lett. 1998, 73, 2561; J. Bharathan, Y. Yang, Appl. Phys. Lett. 1998, 72, 2660; T. R. Hebner, C. C. Wu, D. Marcy, M. L. Lu, J. Sturm, Appl. Phys. Lett. 1998, 72, 519); and WO 99/48160.

The injection of holes from the hole injecting layer such as ITO into the organic emissive layer is controlled by the energy difference between the hole injecting layer work function and the highest occupied molecular orbital (HOMO) of the emissive material, and the chemical interaction at the interface between the hole injecting layer and the emissive material. The deposition of high work function organic materials on the hole injecting layer, such as poly (styrene sulfonate)-doped poly (3,4-ethylene dioxythiophene) (PEDOT/PSS), N,N'-diphenyl-N, N'-(2-naphthyl)-(1, 1'-phenyl)-4, 4'-diamine (NBP) and N,N'-bis(3-methylphenyl)-1, 1'-biphenyl-4, 4'-diamine (TPD), provides hole transport layers (HTLs) which facilitate the hole injection into the light emitting layer, transport holes stably from the hole injecting electrode and obstruct electrons. These layers are effective in increasing the number of holes introduced into the light emitting layer. However, the surface of ITO is not well defined and the chemistry at the interface with these conventional hole transport materials is hard to control.

As an alternative to the high work function organic materials such as PEDOT/PSS, high resistivity inorganic layers have been proposed for use as hole transport layers in, for example, EP-A-1009045, EP-A-1022789, EP-A-1030539 and EP-A-1041654. EP-A-1022789 discloses an inorganic hole transport layer which is capable of blocking electrons and has conduction paths for holes. The layer has a high resistivity, stated to be preferably in the region of 103 to 108 $\Omega$-cm. The materials which are disclosed have the general formula $(Si_{1-x}Ge_x)O_y$, wherein $0 \leq x \leq 1$ and $1.7 \leq y \leq 2.2$. The work function of this hole transport layer is not well defined and is likely to vary depending upon the actual identity of x and y.

More recently, Chen et al, Applied Physics Letters 87, 241121 (2005) has disclosed a connecting structure for tandem organic light-emitting devices. The connecting structure consists of a thin metal layer as the common electrode, a hole-injection layer (HIL) containing molybdenum trioxide on one side of the common electrode, and an electron-injection layer involving $Cs_2CO_3$ on the other side. Such a connecting structure permits opposite hole and electron injection into two adjacent emitting units and gives tandem devices superior electrical and optical performances. The structure is prepared wholly by thermal evaporation.

Kanai et al, Organic Electronics 11, 188-194 (2010) discloses that an electronic structure at the $\alpha$-NPD/$MoO_3$/Au interfaces has been investigated (molybdenum trioxide deposied by thermal evaporation). It was found that the molybdenum trioxide layer contains a number of oxygen vacancies prior to any treatment and gap states are induced by the partial filling of the unoccupied 4d orbitals of molybdenum atoms neighbouring oxygen vacancies. The $\alpha$-NPD thickness dependence of XPS spectra for the α-NPD/MoO$_3$ system clearly showed that molybdenum atoms at the surface of the molybdenum trioxide film were reduced by α-NPD deposition through the charge-transfer interaction between the adsorbed α-NPD and the molybdenum atoms. This reduction at the α-NPD/MoO$_3$ interface formed a large interface dipole layer. The deduced energy-level diagram for the α-NPD/MoO$_3$/Au interfaces describes the energy-level matching that explains well the significant reduction in the hole-injection barrier due to the molybdenum trioxide buffer layer.

Bolink et al, Adv. Funct. Mater. 18, 145-150 (2008) discloses a form of bottom-emission electroluminescent device in which a metal oxide is used as the electron-injecting contact. The preparation of the device comprises thermal deposition of a thin layer of a metal oxide on top of an indium tin oxide covered glass substrate, followed by the solution processing of the light-emitting layer and subsequently the deposition of a high-workfunction (air-stable) metal anode. The authors showed that the device only operated after the insertion of an additional hole-injection layer in between the light-emitting polymer (LEP) and the metal anode.

In summary, this recent prior art describes the use of thermally evaporated molybdenum trioxide as either hole injecting layers (HILs) or as electron injecting layers. However, while the use of molybdenum trioxide and potentially other transition metal oxides as a hole injecting layer to dope the interface between an anode and a semiconducting hole transport layer improves the efficiency of injection of holes from the hole injecting anode to the semiconducting layer, the thermal evaporation techniques used to deposit the molybdenum trioxide HILs are not ideal for scaling up for use on a manufacturing scale.

There is therefore a need for an improved process for the preparation of OLED devices that is solution-based, overcoming the scale-up problems noted above for the prior art thermal deposition techniques and which allows the tuning of the p-acceptor strength of the resulting deposited transition metal oxide layer acting as a hole injection layer to the HOMO levels (i.e. ionisation potentials) of the hole transporting conjugated materials.

SUMMARY OF THE INVENTION

In contrast to the prior art use of evaporated molybdenum trioxide, we have found that it is possible to tailor the acceptor strength in solution-deposited transition metal oxides such as molybdenum trioxide by the choice of the transition metal oxide precursor materials, and by chemically modifying the transition metal oxide ink formulations.

This is important because adjusting the acceptor strength of solution-deposited transition metal oxides such as molybdenum trioxide allows the control of the extent of doping (i.e. the doping profile) in composite Hole Injection Layers (HILs) which are formed according to the invention at the interface between solution-deposited transition metal oxides and layers of hole-transporting or inter-layer (IL) polymer.

Examples are given below that show that the appropriate choice of transition metal oxide precursor material allows optimisation of the charge injection into deep-HOMO conjugated materials, and of the External Quantum Efficiencies in OLEDs.

Thus, in a first aspect of the present invention there is provided:
(1) a process for the adjustment of the electron acceptor strength of a transition metal oxide to the HOMO (highest occupied molecular orbital) energy level of a semiconducting hole transport layer material in a device comprising an anode, a layer of said transition metal oxide deposited on said anode and a layer of said semiconducting hole transport layer material deposited on said transition metal oxide layer, said process comprising:
(a) depositing a solution comprising a precursor for said transition metal oxide on said anode, wherein the precursor solution is selected so that the electron acceptor strength of the transition metal oxide for which the solution is a precursor is adjusted relative to the HOMO level of said semiconducting hole transport layer material;
(b) drying the deposited solution to form a solid layer precursor layer;
(c) depositing a solution of said semiconducting hole transport layer material onto said solid layer precursor layer; and
(d) annealing thermally the product of step (c) to give the desired device having transition metal oxide at the interface between said anode and said semiconducting hole transport layer wherein the electron acceptor strength of the transition metal oxide is adjusted to the HOMO of the semiconducting hole transport layer material.

For the sake of clarity, it should be noted that the HOMO of, for example, said semiconducting hole transport layer material is the same as the 'ionisation potential' of said material. The two are effectively interchangeable, but for consistency we will refer herein to the HOMO.

A typical OLED geometry includes
a transparent conductive oxide anode (e.g. ITO)
a Hole Injection Layer (HIL)
a Hole Transport Layer (HTL)/Inter-Layer (IL)
a Light-Emitting Polymer Layer (LEP)
an evaporated cathode (e.g. NaF—Al—Ag).

The following requirements in terms of band alignment between layers in the OLED have to be fulfilled:
efficient hole injection into the LEP layer requires the band offset between the HTL/IL and the LEP layer to be small
as a consequence of this requirement, in the case of deep-HOMO LEP materials, the HTL/IL also needs to display a high ionisation potential (i.e. a deep-HOMO level)
in order to enable hole injection from the ITO anode into deep-HOMO HTL/IL materials, the Work Function (WF) of the ITO anode needs to be increased from 5.0 eV for native ITO to match the HOMO level in the HTL/IL material.

In order to match the WF of the ITO anode to the HOMO level in the HTL/IL material, the surface of the ITO anode can be covered with a thin layer of a p-doped conjugated polymer (Hole Injection Layer, HIL), according to prior art procedures. An example of a commonly used HIL is PEDOT-PSS, as discussed above.

An alternative approach which is based on creating a doped interface between the Indium Tin Oxide (ITO) anode and an adjacent HTL/IL in an OLED device is disclosed in our co-pending GB Application.

This novel approach comprises the following steps:
1. Formulation of the transition metal oxide precursor solution (water- or organic solvent-based);
2. Deposition of the transition metal oxide precursor solution onto the anode surface;
3. Spin-coating of a solution of a HTL material (Inter-layer polymer, pendant polymer, conjugated host material, or organic semiconductor material) onto the transition metal oxide precursor-modified anode contacts; and 4. Thermal annealing then results in diffusion of transition metal oxide and the formation of a p-doped interface between the HTL material and the anode contact, which enables efficient injection of holes from the anode into the HTL material.

The present invention is a development of that invention to address the specific requirements of adjusting the electron acceptor strength of the transition metal oxide layer to the HOMO levels (i.e. ionisation potentials) in different semiconducting hole transport materials, particularly the use of specific combinations of transition metal oxide precursors and deep-HOMO hole transport layers/interlayers for efficient hole injection into deep-HOMO polymer layers, as well as providing strategies for optimising the luminance efficiency of OLEDs by appropriate choice of $MoO_3$ precursor material, and by optimising the thickness of the hole transport layer/interlayer between the $MoO_3$ deposit and the LEP layer in the OLED device.

Preferred embodiments of the first aspect of the present invention include:

(2) a process according to (1) wherein the electron acceptor strength of the transition metal oxide for which the solution is a precursor is optimised relative to the HOMO level of said semiconducting hole transport layer material;

(3) a process according to (1) or (2) wherein the electron acceptor strength of the transition metal oxide is adjusted or optimised relative to the HOMO level of the semiconducting hole transport layer material to be deposited thereon by adjusting the pH of the solution of the precursor for said transition metal oxide;

(4) a process according to (3) wherein the pH of the precursor solution is selected or adjusted to have a value lying in the range from 1 to 7;

(5) a process according to (3) wherein the pH of the precursor solution is selected or adjusted to have a value lying in the range from 3 to 6;

(6) a process according to (3) wherein the pH of the precursor solution is selected or adjusted to have a value lying in the range from 1 to 2;

(7) a process according to any one of (1) to (6) wherein said transition metal oxide is an oxide of molybdenum, tungsten or vanadium;

(8) a process according to any one of (1) to (6) wherein said transition metal oxide is selected from molybdenum trioxide, tungsten trioxide and vanadium pentoxide;

(9) a process according to (8) wherein said precursor solution is a precursor solution for molybdenum trioxide and it comprises a dispersion or a dissolution of molybdenum trioxide, ammonium molybdate, phosphomolybdic acid or molybdic acid (in which the molybdic acid is partially neutralised with $NH_4OH$) in water;

(10) a process according to (9) wherein said precursor solution is a dissolution of molybdenum trioxide in water at a pH ranging from 1 to 2.5;

(11) a process according to (8) wherein said precursor solution is a dispersion or a dissolution of phosphomolybdic acid in a polar organic solvent;

(12) a process according to any one of (1) to (11) comprising the following further steps:
(a) depositing a solution of a second semiconducting hole transport layer material onto the first semiconducting hole transport layer material, said second semiconducting hole transport layer material having a deeper HOMO level than said first semiconducting hole transport layer material; and
(b) annealing thermally the product of step (a) to give a desired device having transition metal oxide at the interface between said anode and the first semiconducting hole transport layer, and a second semiconducting hole transport layer material having a deeper HOMO level than said first semiconducting hole transport layer material stacked on said first semiconducting hole transport layer material;

(13) a process according to any one of (1) to (11) comprising the following further steps:
(a) depositing a solution of a second semiconducting hole transport layer material onto the first semiconducting hole transport layer material, said second semiconducting hole transport layer material being the same as said first semiconducting hole transport layer material; and
(b) annealing thermally the product of step (a) to give a desired device having transition metal oxide at the interface between said anode and the first semiconducting hole transport layer, and a second semiconducting hole transport layer material that is the same as the first semiconducting hole transport layer material stacked on said first semiconducting hole transport layer material;

(14) a process according to any one of (1) to (11) comprising the following further steps:
(a) depositing a solution of a second semiconducting hole transport layer material onto the first semiconducting hole transport layer material, said second semiconducting hole transport layer material being different to said first semiconducting hole transport layer material but having a similar HOMO level to that of said first semiconducting hole transport layer material; and
(b) annealing thermally the product of step (a) to give a desired device having transition metal oxide at the interface between said anode and the first semiconducting hole transport layer, and a second semiconducting hole transport layer material stacked having a similar HOMO level to that of said first semiconducting hole transport layer material on said first semiconducting hole transport layer material;

(15) a process according to any one of (1) to (14) for the production of an organic light emitting device, said process comprising the following further steps:
(a) depositing a solution of a light emitting polymer on the top layer of semiconducting hole transport material;
(b) drying said layer of light emitting polymer to give a light emitting polymer layer; and
(c) thermally evaporating a low work function metal onto the light emitting polymer layer formed in step (b) to form a cathode, thus giving the desired organic light emitting device;

(16) a process according to (15) wherein said light emitting polymer is formed from the following monomers:

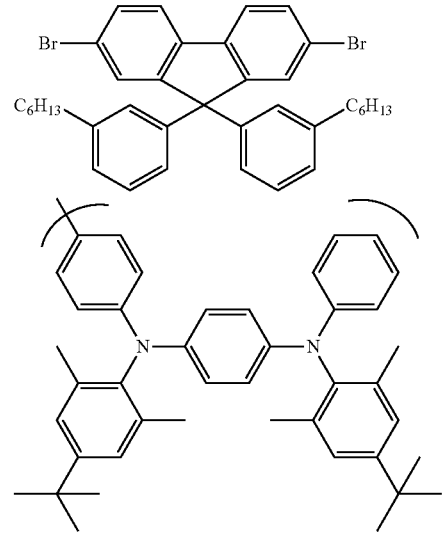

-continued

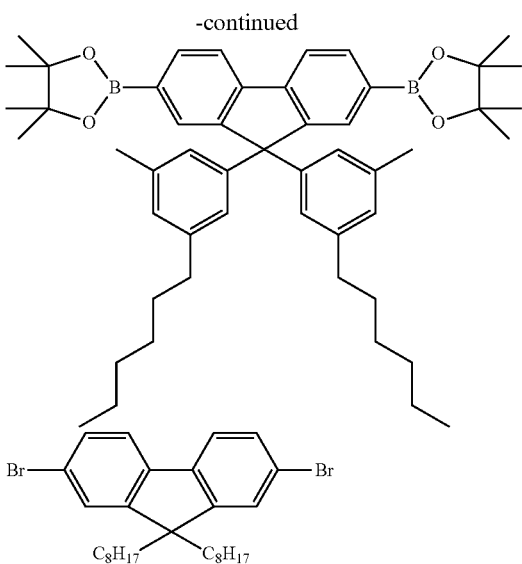

(17) a process according to (15) or (16) wherein the low work function metal that forms the cathode is a bi-layer or tri-layer structure of metals or compounds selected from sodium fluoride, aluminium, calcium and silver;

(18) a process according to any one of (15) to (17) wherein the external quantum efficiency of the organic light emitting device is optimised by varying the thickness of the semiconducting hole transport layer;

(19) a process according to (18) wherein the external quantum efficiency of the organic light emitting device is optimised by increasing the thickness of the semiconducting hole transport layer;

(20) a process according to any one of (1) to (17) wherein the external quantum efficiency of the organic light emitting device is optimised by adjusting the acceptor strength of the transition metal oxide precursor;

(21) a process according to (20) wherein the external quantum efficiency of the organic light emitting device is optimised by reducing the acceptor strength of the transition metal oxide precursor; and

(22) a process according to (21) wherein the acceptor strength of the transition metal oxide precursor is reduced by increasing the pH of the precursor solution.

Devices produced using the process of the present invention also form a part of the invention. Thus, in a second aspect of the present invention, there is provided:

(23) a device comprising an anode, a layer of transition metal oxide deposited on said anode and a layer of semiconducting hole transport material deposited on said transition metal oxide layer wherein the hole acceptor strength of said transition metal oxide is optimised relative to the HOMO level of said semiconducting hole transport material;

(24) a device according to (23) wherein the optimisation of the hole acceptor strength of said transition metal oxide to the HOMO levels of said semiconducting hole transport material is achieved using a process according to any one of (1) to (14);

(25) a device according to (23) or (24) wherein said device is an organic light emitting device; and

(26) an organic light emitting device according to (25) produced using a process according to any one of (15) to (22).

DETAILED DESCRIPTION OF THE INVENTION

Solution-based processing of transition metal oxides such as molybdenum trioxide according to the process of the present invention enables the use of simple and cost-effective deposition techniques such as spin-coating, dip-coating or doctor-blading to deposit said transition metal oxides. It also allows the electron acceptor strength of the transition metal oxide for which the solution is a precursor to be readily optimised relative to the HOMO level of said hole transport layer material. In contrast to thermal evaporation, solution-based deposition techniques do not require vacuum, and can therefore easily be scaled-up to large substrate sizes and/or reel-to-reel fabrication processes. This is a substantial advantage as it enables manufacturing-scale process solutions to be achieved for the desired device architecture in which the devices comprise a transition metal oxide doped interface between an anode and a semiconducting hole transport layer, something that has not previously been readily achievable.

Energy Level Measurement

HOMO and LUMO energy level values may be calculated by any method known to the skilled person in order to determine the energy levels required. A suitable measurement method is photoelectron spectroscopy using AC-2 apparatus available from RK Instruments Inc.

Measurements may alternatively be made using ultraviolet photoelectron spectroscopy measurements performed in a vacuum system, by irradiating the sample surface with ultraviolet light of a fixed wavelength. This measurement results in plots of the Photoelectron Intensity as a function of Kinetic Energy, which are 1:1-projections of the Density-Of-State in the sample substrate.

HOMO levels of various organic compounds can also be found in, for example, Dekker, Handbook of Photophysics, $2^{nd}$ Edition, 1993.

The present invention provides a range of solution-based strategies using precursors for transition metal oxide hole injection layers:

(i) use of a variety of transition metal oxide precursor materials that enable the adjustment of the acceptor strength of the resulting transition metal oxide deposit to the HOMO levels in different hole transport layer materials;

(ii) specific combinations of transition metal oxide precursors and deep-HOMO hole transport layer materials for efficient hole injection into deep-HOMO polymer layers; and (iii) strategies for optimising the luminance efficiency of OLEDs by appropriate choice of transition metal oxide precursor material, and by optimising the thickness of the hole transport layer material between the transition metal oxide deposit and the light emitting polymer layer in the OLED device.

In a preferred embodiment, the hole injection into the hole transport layer material can be maximised by ensuring the electron acceptor strength of the transition metal oxide is adjusted to the HOMO of the hole transport layer material.

By solution-depositing the transition metal oxide, it is possible to adjust the electron acceptor strength of the transition metal oxide to the HOMO, i.e. ionisation potential of the hole transport layer material, thus allowing the optimisation of charge-injection into deep-HOMO hole transport materials. This enables the use of deep-HOMO hole transport layer materials in the manufacture of OLEDs having deep-HOMO light emitting polymers (LEPs).

In one embodiment of the present invention, we have found that the acceptor strength of the transition metal oxide may be optimised to the HOMO levels of the semiconducting hole transport layer material to be deposited thereon by adjusting the pH of the solution of the precursor for said transition metal oxide. Typically, the pH of the precursor solution is adjusted to a range from 1 to 7. However, in principle, in the case of precursor solutions for molybdenum trioxide the pH of the precursor solution may be adjusted to a range from 1 to 12.

The optimum pH value therefore depends on (1) the choice of transition metal oxide (e.g. $MoO_3$, $WO_3$ and $V_2O_5$), and (2) the choice of HTL material.

Using molybdenum as an example of the transition metal oxide for use in the in invention, a common feature in solutions of molybdenum trioxide precursors is the presence of strong Lewis acid—Lewis base interactions between the molybdenum (VI) compounds and electron lone pairs of the solvent molecules.

In the case of molybdenum trioxide dispersions in water, this results in a number of complex chemical interactions between the precursor material and the water molecules:

Molybdenum (VI) oxide is slightly soluble in water and reacts to form molybdic Acid:

$$MoO_3 + H_2O \rightarrow H_2MoO_4.$$

As a function of pH value, Molybdic Acid poly-condenses to form a wide range of polyanionic species such as:

$$7MoO_4^{2-} + 8H^+ \rightarrow Mo_7O_{24}^{6-} + 4H_2O$$

or $$Mo_8O_{26}^{4-}, Mo_{36}O_{112}(H_2O)_{16}^{8-}.$$

As a consequence of these chemical interactions, the pH of the resulting solution determines both the saturation concentration of dissolved molybdenum trioxide ("molybdic acid") and the structural properties of the resulting (polycondensed) molybdic acid species.

We have found that the more acidic the precursor solution of transition metal oxide used, the more potent is the resulting deposited transition metal oxide layer in acting as an electron acceptor and p-dopant. Thus, formulations with low pH enable the doping of—and hole injection into—deep-HOMO conjugated materials. Formulations with partly neutralised precursors (increased pH) enable the tuning of the acceptor strength of the transition metal oxide deposit and control of the doping profile in adjacent semiconducting hole transport layers. This is relevant for optimising the luminance efficiency in OLED applications.

Thus, the acceptor strength of solution-processed transition metal oxides such as molybdenum trioxide can be tuned by adjusting the pH of the precursor solution. For example, molybdenum trioxide produced from molybdic acid as a precursor (partially neutralised with $NH_4OH$—pH in the region of 4) is a less potent dopant than molybdenum trioxide produced using dissolutions or dispersions of molybdenum trioxide in water as a precursor having a pH in the range 1.5-2.0.

Any transition metal oxide with electron accepting properties that match the ionisation potential of a semiconducting hole transport layer is suitable for use in the present invention. Preferred transition metal oxides are oxides of molybdenum, tungsten or vanadium in their highest oxidation states. Preferred transition metal oxides are selected from molybdenum trioxide, tungsten trioxide and vanadium pentoxide, of which molybdenum trioxide is particularly preferred.

Solution-deposition of the transition metal oxide is achieved through use of a precursor solution of said transition metal oxide. Taking molybdenum trioxide as an example, precursor solutions for molybdenum trioxide comprise, for example, a dispersion or a dissolution of molybdenum trioxide, ammonium molybdate, phosphomolybdic acid or molybdic acid (in which the molybdic acid is partially neutralised with $NH_4OH$ to a pH in the region of 4) in water or a dispersion or a dissolution of phosphomolybdic acid in a polar organic solvent (e.g. pyridine, acetonitrile or tetrahydrofuran). A preferred precursor solution for molybdenum trioxide in the case of deep-HOMO hole transport materials is a dissolution of molybdenum trioxide in water at a pH of from 1 to 2.5.

Precursor solutions for tungsten trioxide include a dispersion or a dissolution of tungsten trioxide, tungstic acid, ammonium tungstate or phosphotungstic acid in water or a dispersion or a dissolution of phosphotungstic acid in a polar organic solvent. Precursor solutions for vanadium pentoxide include a dispersion or a dissolution of vanadium (V) oxide, ammonium metavanadate, vanadium(V) oxytriethoxide, vanadium(V) oxytriisopropoxide or vanadium(V) oxytripropoxide in water or a dissolution of vanadium(V) oxytriethoxide, vanadium(V) oxytriisopropoxide or vanadium(V) oxytripropoxide in a polar organic solvent.

To fabricate OLEDs with a transition metal oxide-based hole injection layer (HIL), the transition metal oxide precursor formulation can be spin-coated onto the ITO anode patterns on the OLED substrate. Alternative deposition techniques include dip-coating and doctor-blading, although any suitable solution deposition technique can be used.

The deposition process comprises several steps, which are detailed in the following, using molybdenum trioxide as an example:

In the case of water-based molybdenum trioxide precursor solutions, it is important that the ITO surface is highly hydrophilic, in order to ensure perfect wettability. This can be achieved by applying oxidative surface pre-treatments prior to depositing the water-based molybdenum trioxide precursor solution. Examples of such oxidative surface treatments include:

Immersion in a hot mixture of concentrated hydrogen peroxide and concentrated ammonium hydroxide ("Piranha solution")

UV-ozone treatments

Oxygen plasma treatments.

After the oxidative surface pre-treatment, the substrates are rinsed with de-ionised water to remove any water-soluble contaminants.

The molybdenum trioxide precursor solution is then applied to the OLED substrate, e.g. by spin-coating.

After spin-coating the molybdenum trioxide precursor, the OLED substrates are dried and then annealed ("pre-Interlayer bake").

A variety of drying procedures can be used, including drying in air, under an inert gas (i.e. in a glove box), or under nitrogen.

Drying/annealing temperatures typically range from 120° C. to 300° C., and the drying/annealing times typically range from several minutes to several hours.

After the "pre-Interlayer bake" step, a solution of the semiconducting hole transport layer (HTL) material is deposited (e.g. by spin-coating) onto the transition metal oxide-modified anode. Possible HTL materials include Interlayers (e.g. see Interlayers 1, 2 and 3 below which are copolymers of the monomers listed) or pendant polymers (e.g. see discussion below).

Interlayer 1

Dibromide—30-50% MONOMER 1, 2-10% BCBF, 2-10% MONOMER 4

Diester—25-45% MONOMER 5, 10-20% F8

Interlayer 2

Dibromide—20-40% MONOMER 6, 8-15% F8, 5-10% BCBF

Diester—40-60% MONOMER 7

Interlayer 3
Dibromide—20-40% MONOMER 8, 10-15% F8, 5-10% BCBF
Diester—40-60% MONOMER 7
F8 (Dibromide)—(for synthesis see U.S. Pat. No. 6,593,450)
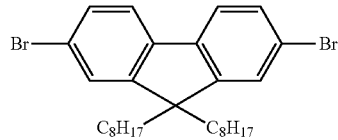
Monomer 7 (Diester)—
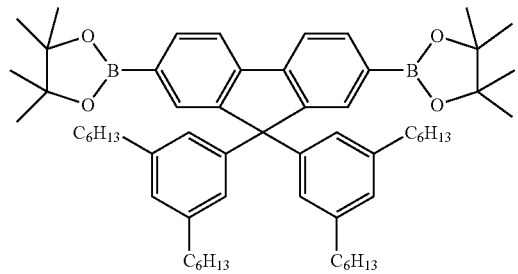
(for synthesis see WO2006/109083, WO2009/066061)
BCBF (Dibromide)—
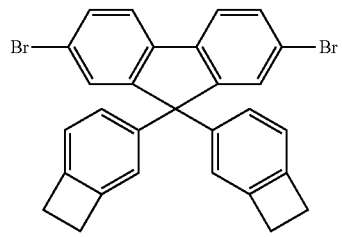 [SMILES: Brc1ccc2c(c1)C(c1ccc3c(c1)CC3)(c1ccc3c(c1)CC3)c1cc(Br)ccc1-2]
(for synthesis see WO2008/038747)
Monomer 5 (Diester)—
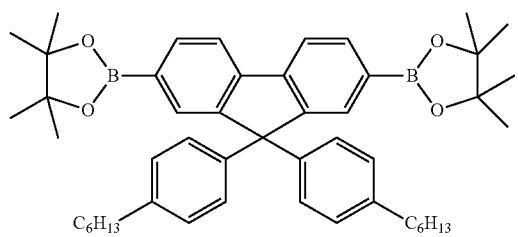
(for synthesis see WO2002/092723)
Monomer 3 (Diester)—
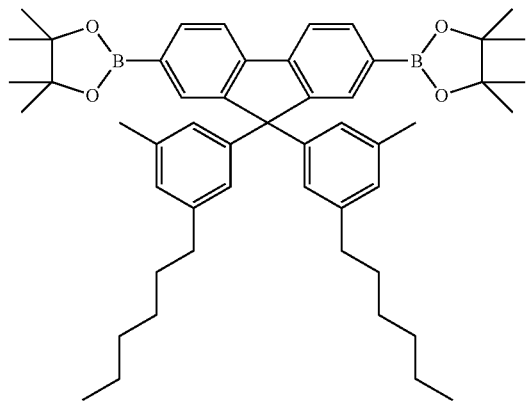
(for synthesis see WO2009/066061)
Monomer 1 (Dibromide)—
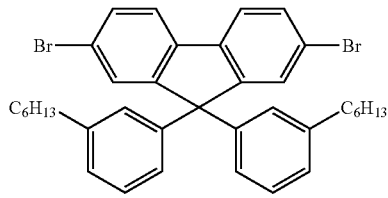
(for synthesis see WO2009/066061)
Monomer 2—
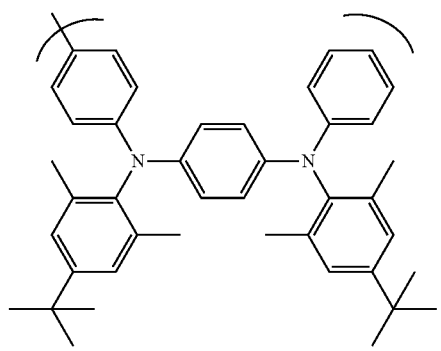 [SMILES: Cc1ccc(N(c2ccc(N(c3ccccc3)c3c(C)cc(C(C)(C)C)cc3C)cc2)c2c(C)cc(C(C)(C)C)cc2C)cc1]
(for synthesis see WO2008/016090, WO2008/111658, WO2009/110642, WO2010/013724.)

Monomer 6 (Dibromide)—

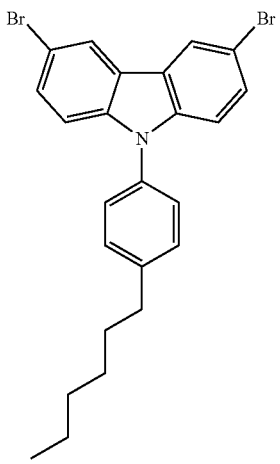 [SMILES: CCCCCCc1ccc(-n2c3ccc(Br)cc3c3cc(Br)ccc32)cc1]

(for synthesis see WO2006/096399, WO2010/013723)
Monomer 8—

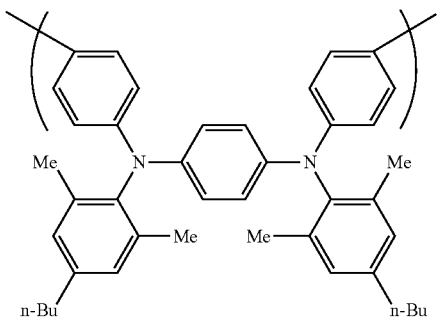

(for synthesis see WO2005/074329, WO2006/123741)
Monomer 4—

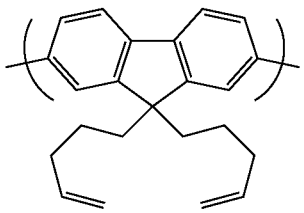

(for synthesis see WO2010/013723, WO2010/013724)

Turning to suitable pendant polymers for use in the present invention, PPV derivatives with carbazole pendants are described in *J. Mater. Chem.*, 2001, 11, 3023-3030 where single layer devices are described (ITO/organic/Al). Prof Jen has published papers on polystyrene based hole transport pendant polymers cross linked on top of ITO//PEDOT in *Adv. Mater.* 2009, 21, 1972-1975 and *J. Mat. Chem.*, 2008 (18) p. 4459. Photo-cross linkable hole conducting polymers are discussed in *Macromolecules* 2005, 38, 1640-1647. Polyfluorene-based pendant polymers have been published in *Macromolecules*, 2009, 42, 4053-4062.

The use of pendant polymers in organic electronic devices is known in the literature. For example, several patents by Thomson describe the use of pendant polymers as active layers in OLED device:

EP0712171A1, EP0850960A1, EP0851017A1, FR2736061A1, FR2785615A1, WO0002936A 1 and WO9965961A 1.

In these patents, various hole-transport and electron-transport units are used as active pendant groups (for instance naphtylimide, carbazole, pyrazoline, benzoxazol, benzothiazole, anthracene and phenanthrene). The backbones are typically polyacrylate, polystyrene or polyethylene. Cross-linking units are also incorporated in the materials to allow subsequent depositions of layers. The cross-linking process can be initiated thermally or photo-induced.

Additional references describing the preparation and use of polymers with pendant active units are given below; in these cases, no cross-linker units are used:

*J. Mat. Chem.*, 2007, 17, 4122-4135, where TTF derivatives are used as pendant groups for electron-donating polymers.

*J. Mat. Chem.*, 1993, 3(1), 113-114: polymers containing pendant oligothiophenes as a novel class of electrochromic materials

*Macromolecules*, 1995, 28, 723-729.

*Applied Physics Letters*, 2006, 88, 093505: carbazole and triphenylamine derivatives for phosphorescent polymer LED.

*Proc. Of SPIE, vol* 6333 63330G-1: hole-transporting and emitting pendant polymers for OLED

*Synthetic Metals*, 2008, 158, 670-675: synthesis of new hole-transport molecular glass with pendant carbazoyl moieties.

*J. Mat. Chem.*, 2008, 18, 4495-4509: in this paper, the authors provide a brief overview of pendant polymers incorporating various cross-linkable units.

For OLED applications, it is important that thermal cross-linkers, e.g. BCBF above are provided in the first HTL layer. This allows the first HTL layer to be rendered insoluble by thermal annealing, prior to spin-coating a second light emitting polymer layer on top of the HTL layer, without re-dissolving the first HTL layer.

Importantly, in addition to rendering the semiconducting hole transport layer (HTL) material insoluble, the thermal cross-linking step results in the diffusion of solution-deposited layer of transition metal oxide such as molybdenum trioxide into the HTL layer, and the formation of a doped ITO—HTL interface.

In one further preferred aspect of the process of the present invention, we have discovered that it can be advantageous to form "bilayer stacks" to enable efficient hole injection into deep-HOMO materials with ionisation potentials up to 5.9 eV. This preferred embodiment of the process of the present invention comprises the following additional steps:

(a) depositing a solution of a second semiconducting hole transport layer material onto the first semiconducting hole transport layer material, said second semiconducting hole transport layer material having a deeper HOMO level than said first semiconducting hole transport layer material; and (b) annealing thermally the product of step (a) to give a desired device having transition metal oxide at the interface between said anode and the first semiconducting hole transport layer, and a second semiconducting hole transport layer material stacked on said first semiconducting hole transport layer material.

If the second semiconducting hole transport layer material having a very deep HOMO level (e.g. 5.9 eV) such as a deep-HOMO pendant polymer is deposited directly onto solution-deposited transition metal oxides such as molybdenum trioxides (i.e. "a single stack"), it is found that the electron acceptor strength of the metal oxide can be too low to allow sufficient doping of and efficient hole injection into the semiconducting hole transport layer material having a deep HOMO level. However, by depositing a first deep-HOMO semiconducting hole transport layer material whose HOMO levels are more closely matched to the electron acceptor strength of the solution-deposited transition metal oxide layer, very efficient hole injection from the transition metal oxide layer into the first deep-HOMO semiconducting hole transport layer material and from that into the second deep-HOMO semiconducting hole transport layer material is found to occur.

In another preferred aspect of the first embodiment of the present invention, there is provided a process for the manufacture of OLEDs. This involves the following additional steps following the completion of steps (a) to (d) of the first embodiment of the invention above (and the possible option of the additional steps to add a second deep-HOMO semiconducting hole transport layer material):

(a) depositing a solution of a light emitting polymer on the layer of semiconducting hole transport material;

(b) drying said layer of light emitting polymer to give a light emitting polymer layer; and (c) thermally evaporating a low work function metal onto the light emitting polymer layer formed in step (b) to form a cathode and hence giving the desired organic light emitting device.

The light emitting polymer can be, for example, LEP 1 (see below):
LEP1
Dibromide—30-50% MONOMER 1, 2-10% MONOMER 2
Diester—30-50% MONOMER 3, 10-20% F8
(all as depicted above)

Preferably, the low work function metal that forms the cathode is a bi or tri layer cathode comprising silver, aluminium, calcium, magnesium and/or sodium fluoride, and preferably a bi-layer structure of aluminium and silver or a tri-layer structure of sodium fluoride, aluminium and silver.

Using the process of the present invention, it is our understanding that thermal annealing results in doping of the interface between solution-deposited transition metal oxide and the adjacent hole transport layer material. Furthermore, depending on both the transition metal oxide precursor and the hole transport layer material, annealing may even result in the diffusion of dopants into the bulk of the hole transport layer polymer, and the formation of a doping profile that extends from the transition metal oxide-hole transport layer interface into the bulk of the hole transport layer.

We have found that both the choice of transition metal oxide precursor material and the thickness of the hole transport layer do impact on the luminance efficiencies of OLED pixels.

Thus, in a preferred embodiment of the aspect of the invention in relation to the process for the manufacture of OLEDs, the external quantum efficiency of the organic light emitting device is adjusted to the desired level by varying the thickness of the semiconducting hole transport layer. More preferably, we have found that the external quantum efficiency of the organic light emitting device can be optimised by increasing the thickness of the semiconducting hole transport layer.

We have also found that in relation to the process for the manufacture of OLEDs, the external quantum efficiency of the organic light emitting device may be maximised/optimised by adjusting the acceptor strength of the transition metal oxide precursor. More preferably, the external quantum efficiency of the organic light emitting device with shallow-HOMO Hole Transport Layers (HTLs) is optimised by reducing the acceptor strength of the transition metal oxide precursor (e.g. by solution-depositing the weaker acceptor compound molybdic acid instead of the stronger acceptor compound molybdenum trioxide). In this way, it is possible to obtain higher OLED external quantum efficiencies in devices with shallow-HOMO semiconducting hole transport layers. The acceptor strength of the transition metal oxide precursor can be decreased by increasing the pH of the solution and adjusted to the ionisation potential (the HOMO level) of the hole transport layer material.

The devices according to the second aspect of the present invention comprise an anode, a layer of transition metal oxide deposited on said anode and a layer of semiconducting hole transport material deposited on said transition metal oxide layer wherein the hole acceptor strength of said transition metal oxide is optimised relative to the HOMO levels of said semiconducting hole transport material. Preferably, the devices are those wherein the optimisation of the hole acceptor strength of said transition metal oxide to the HOMO levels of said semiconducting hole transport material is achieved using a process according to any one of (1) to (12) above.

Preferred devices according to the present invention are organic light emitting devices, particularly those produced using a process according to any one of (13) to (20). The material used for the production of the anode may be any material used in the art for this purpose. A preferred example is a tin-doped indium oxide (ITO)-coated glass substrate. Materials for use as the transition metal oxide, hole transport material, light emitting polymer and cathode are discussed above.

The present invention may be further understood by consideration of the following examples with reference to the following drawings.

EXAMPLE 1

Figure 1:
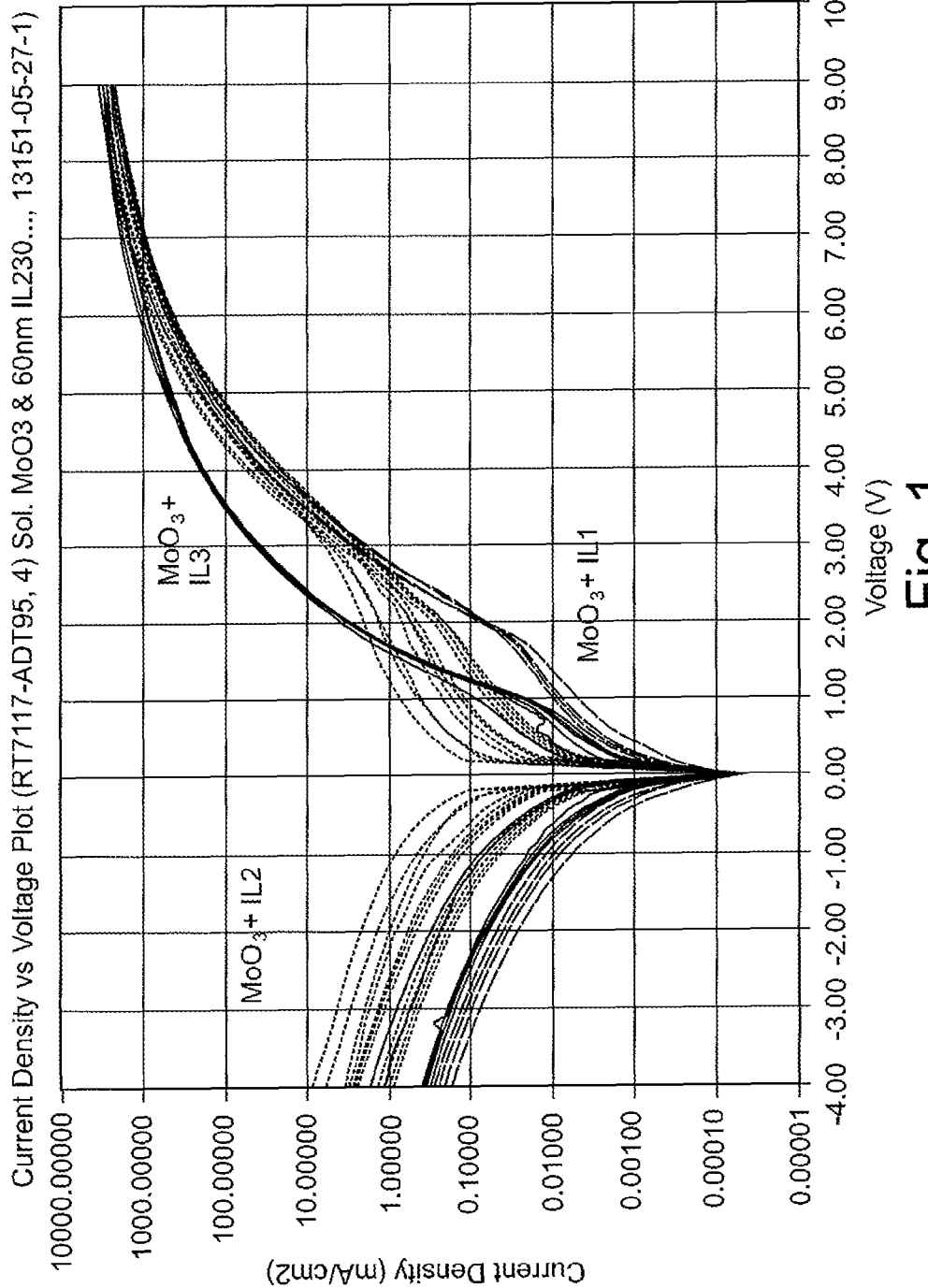
FIG. 1 shows I-V characteristics for a variety of devices comprising solution-deposited $MoO_3$ as a precursor with different hole transporting "inter-layers"

Process for the Manufacture of Devices Comprising Solution-Processed $MoO_3$ as a Hole Injection Layer The acceptor strength of solution-deposited $MoO_3$ depends on the $MoO_3$ precursor material.

For the purpose of this disclosure, this has been exemplified by spin-coating aqueous solutions (0.2% w/w) of
- Molybdenum trioxide (MoO₃)
- Phosphomolybdic acid (12MoO₃ x H₃PO₄), or
- Molybdic Acid (partly neutralised with NH₄OH), all purchased from Sigma-Aldrich, onto OLED substrates with ITO patterns.

After successive annealing steps in air and in a glovebox, the substrates were spin-coated with thin layers (60 nm) of a variety of hole transport layer (inter-layer) polymers and a pendant polymer host material, which display a range of ionisation potentials:

| HT material | Ionisation potential (eV) |
|---|---|
| Interlayer 3 | 5.2 eV |
| Interlayer 2 | 5.6 eV |
| Interlayer 1 | 5.8 eV |
| Polymer 1 | 5.9 eV |

Polymer 1 is a pendant polymer, in which carbazole groups are attached to the polymer backbone via alkyl linkers that are attached to the carbazole nitrogen (N-alkylation).

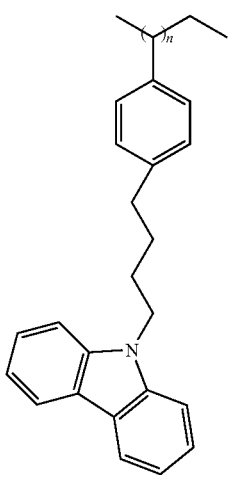

The synthesis of polymers of this type is disclosed in Jin et al. Bull. Korean Chem. Soc. 2007, Vol 28, no 12, p 2419.

Using aqueous solutions of MoO₃ as an example, this procedure was conducted as follows.

(a) Preparation of a Water-Based Molybdenum Trioxide Precursor Formulation

Molybdenum trioxide powder (obtained from Sigma Aldrich) was dispersed in deionised water (0.2% w/w). The dispersion was ultrasonicated for 1 hour, and then heated at 80° C. for 2 hours. The resulting mixture was then allowed to cool to room temperature and stored overnight on a roller. The mixture was then filtered through PVDF syringe disc filters (pore size 0.1 micron) to give the desired water-based molybdenum trioxide precursor formulation ("molybdic acid").

(b) Deposition of a Water-Based Molybdenum Trioxide Precursor Formulation on ITO An OLED substrate comprising ITO contact patterns on glass was pre-cleaned by rinsing with organic solvents and deionised water. A short UV-ozone treatment (120 seconds) was then applied to render the substrate hydrophilic. After the UV-ozone treatment, the substrate was rinsed with deionised water, and blown dry with nitrogen gas.

A freshly filtered solution of molybdenum trioxide precursor in deionised water (prepared as described in (a) above) was spin-coated onto the pre-cleaned OLED substrate (1200 rpm, 60 seconds). After spin-coating the molybdenum trioxide precursor onto the substrate, the substrate was dried in air (120° C. for 10 minutes), and the precursor was then annealed under nitrogen (200° C. for 30 minutes in a glove box) to give the desired molybdenum oxide modified ITO substrate.

Using the molybdenum trioxide precursor solution of (a), and the deposition parameters of (b), the thickness of the resulting molybdenum trioxide deposit on ITO was typically less than 1 nm (AFM surface roughness data).

The work function of native ITO (approx. 5.0 eV) was found to increase to from 5.3-5.6 eV after treatment with the molybdenum trioxide precursor, depending on the process conditions.

(c) Comparison of Devices Fabricated with Different HILs

After the "pre-Interlayer bake" was prepared in (b), a Hole Transport Layer (inter-layer) was spin-coated onto the molybdenum trioxide-modified ITO contacts. Interlayers 1, 2 and 3 pendant polymer Polymer 1 were used for the examples.

For the purpose of this invention, this doped ITO—HTL interface acts as a "hole injection layer" (HIL) by ensuring low contact resistance.

After deposition of the hole transport layer, the resulting device is annealed. In some of the following examples, a layer of pendant polymer was deposited on either the "pre-interlayer bake" formed in step (b) and in others it was deposited on the inter-layer after annealing in step (c) and then it is itself annealed. Annealing of the inter-layer is crucial, as it leads to the creation of the p-doped ITO—HTL interface.

As an example of the specific conditions employed, for Interlayer 3 spin-coating of the Interlayer/HTL:
- Interlayer 3 was dissolved in ortho-xylene (0.6 wt %)
- Spin-coating was then performed at 1500 rpm/6 sec in glove box
- Annealing was then performed—temperature/time: 200° C./15 min in a glove box Annealing rendered the first Interlayer polymer insoluble, and thereby allowed the deposition by spin-coating of a second interlayer polymer.

Using the general conditions described above, substrates coated with following inter-layer polymers and pendant polymer host material, having the following range of ionisation potentials were formed:
- CDTOx Interlayer 3 (IP=5.2 eV)
- CDTOx Interlayer 2 (IP=5.6 eV)
- CDTOx Interlayer 1 (IP=5.8 eV)
- CDTOx Polymer 1 (IP=5.9 eV).

EXAMPLE 2

Aqueous Solutions of MOO₃ as Precursor Materials for Efficient Hole Injection into Deep-Homo Hole Transport Layer (Inter-Layer) Materials Device Geometry:

The procedure described in Example 1 above was adopted to provide OLED substrates with ITO patterns having deposited thereon a thin layer of MoO₃ (i.e. MoO₃ deposited from an aqueous solution thereof). A variety of hole transport layer (inter-layer) polymers and in one case an additional pendant polymer (layer thickness 60 nm) was then spin-coated onto the substrates and the substrates were annealed. The devices were then finalised by the thermal evaporation of a silver-aluminium cathode onto the hole transport layer (inter-layer)

or pendant layer to give hole-only devices having the architecture [ITO/solution-deposited $MoO_3$/60 nm IL/Al—Ag]. Typically, the cathode is deposited by thermal evaporation of, for example 200 nm of Al and 100 nm of Ag in successive steps.

Result

As can be seen from FIG. 1, there was efficient hole injection into each of the deep HOMO hole transport layer (inter-layer) polymers Interlayer 3, Interlayer 2, and Interlayer 1. Thus, it can be concluded that solution-deposited $MoO_3$ enables efficient hole injection into conjugated hole transport layer (inter-layer) polymers with ionisation potentials of up to 5.8 eV.

EXAMPLE 3

Solution-Deposited $MOO_3$—Interlayer 1 Bi-Layer Stacks as Composite Hole Injection Layers for Deep-Homo Conjugated Materials The same process as in Example 2 was followed except in one instance the polymer that was spun onto the $MoO_3$ deposited from an aqueous solution thereof was a 60 nm layer of the pendant polymer Polymer 1 and the substrate then annealed while in the other case a 30 nm layer of the deep-HOMO hole transport layer (inter-layer) Interlayer 1 was first spun onto the $MoO_3$ and the substrate annealed before a second 30 nm layer of Polymer 1 was spun onto the Interlayer 1 layer. Polymer 1 was spin-coated from 1.75 wt. % solutions in ortho-xylene and annealed at 200° C. for 15 minutes.

Spin-coating conditions:

All films were spin-coated in a glove box.

60 nm films were achieved using the following spin-coating parameters: 1080 rpm/s acceleration, 1500 rmp final speed, 6 s spin duration.

30 nm films were achieved using the following spin-coating parameters: 2120 rpm/s acceleration, 1500 rmp final speed, 6 s spin duration.

Interlayer 1 was spin-coated from a 0.6 wt. % solution in ortho-xylene and dried at 200° C. for 15 min.

30 nm films were achieved using the following spin-coating parameters: 1480 rpm/s acceleration, 1500 rmp final speed, 6 s spin duration.

Device Geometry: Hole-only devices with the architecture [ITO/solution-deposited $MoO_3$/60 nm Polymer 1 or [30 nm Interlayer 1+30 nm Polymer 1]/Al—Ag]

Figure 2:
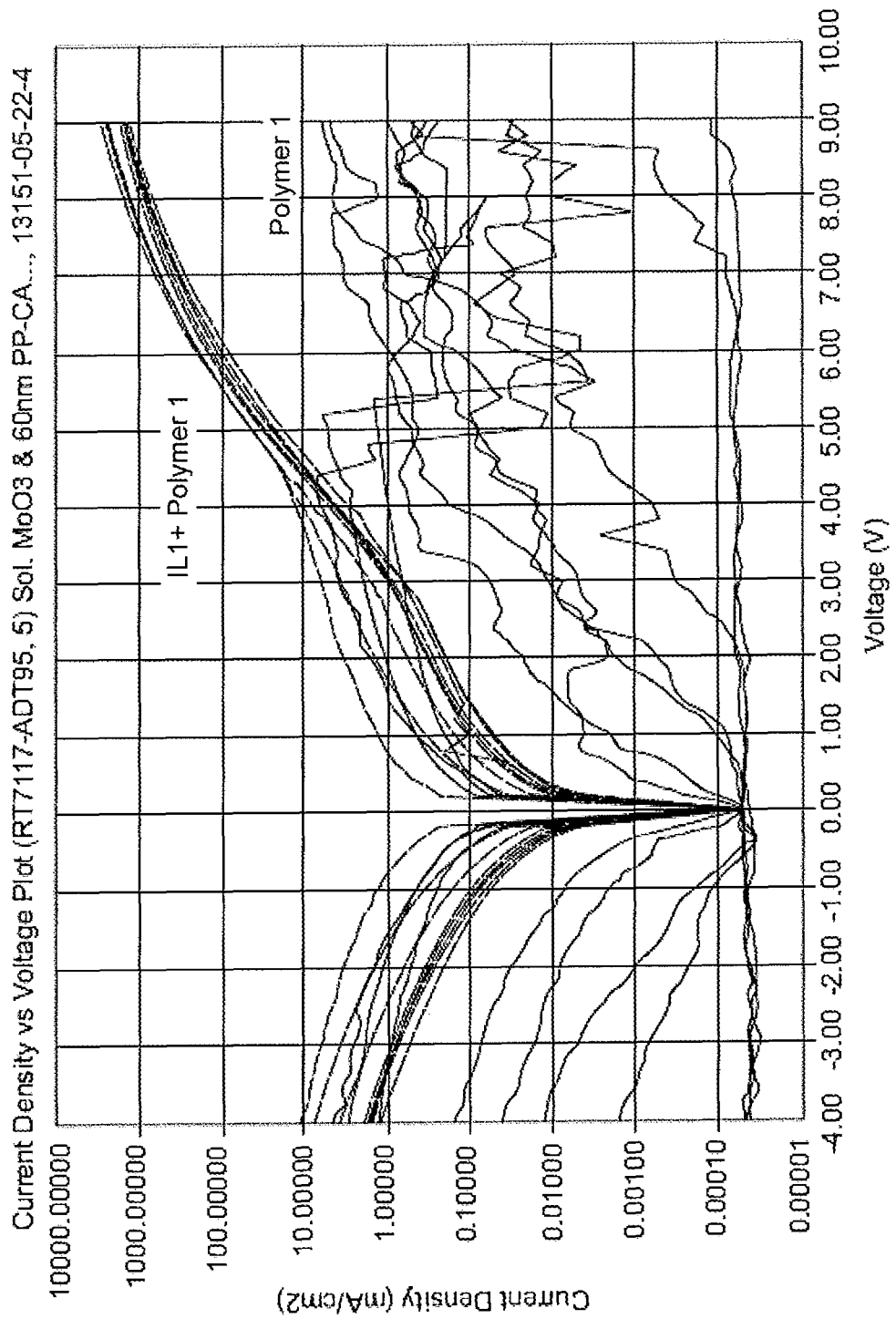
FIG. 2 shows I-V characteristics for devices comprising solution-deposited $MoO_3$ as a precursor, one with a deep-HOMO pendant polymer deposited thereon and one with comprising a stack of a hole transporting "inter-layer" and the deep-HOMO pendant polymer.

Results:

As can be seen from FIG. 2, no hole injection was obtained from solution-deposited $MoO_3$ into Polymer 1 alone. However, the bi-layer stack comprising [solution-deposited $MoO_3$+hole transport layer polymer Interlayer 1] enabled efficient hole injection into the deep-HOMO pendant polymer Polymer 1.

It can thus be concluded that composite bi-layer hole transport polymers (injection layers) comprising solution-deposited $MoO_3$ and a deep-HOMO hole transport layer (inter-layer) polymer such as Interlayer 1 enable efficient hole injection into the deep-HOMO materials with ionisation potentials up to 5.9 eV.

EXAMPLE 4

Tuning the Acceptor Strength of Solution-Deposited $MOO_3$

A similar procedure was followed to that as in Example 1 and 2, except in place of the solution of molybdenum oxide in water, a molybdic acid solution (purchased from Sigma-Aldrich; comprises predominantly the ammonium salt, i.e. partly pH-neutralised, with a pH of 4.0). Deposition and annealing conditions were the same as for the $MoO_3$ precursor.

Device geometry: Hole-only devices with [ITO/solution-deposited Molybdic Acid/60 nm IL/Al—Ag]

Results

Figure 3:
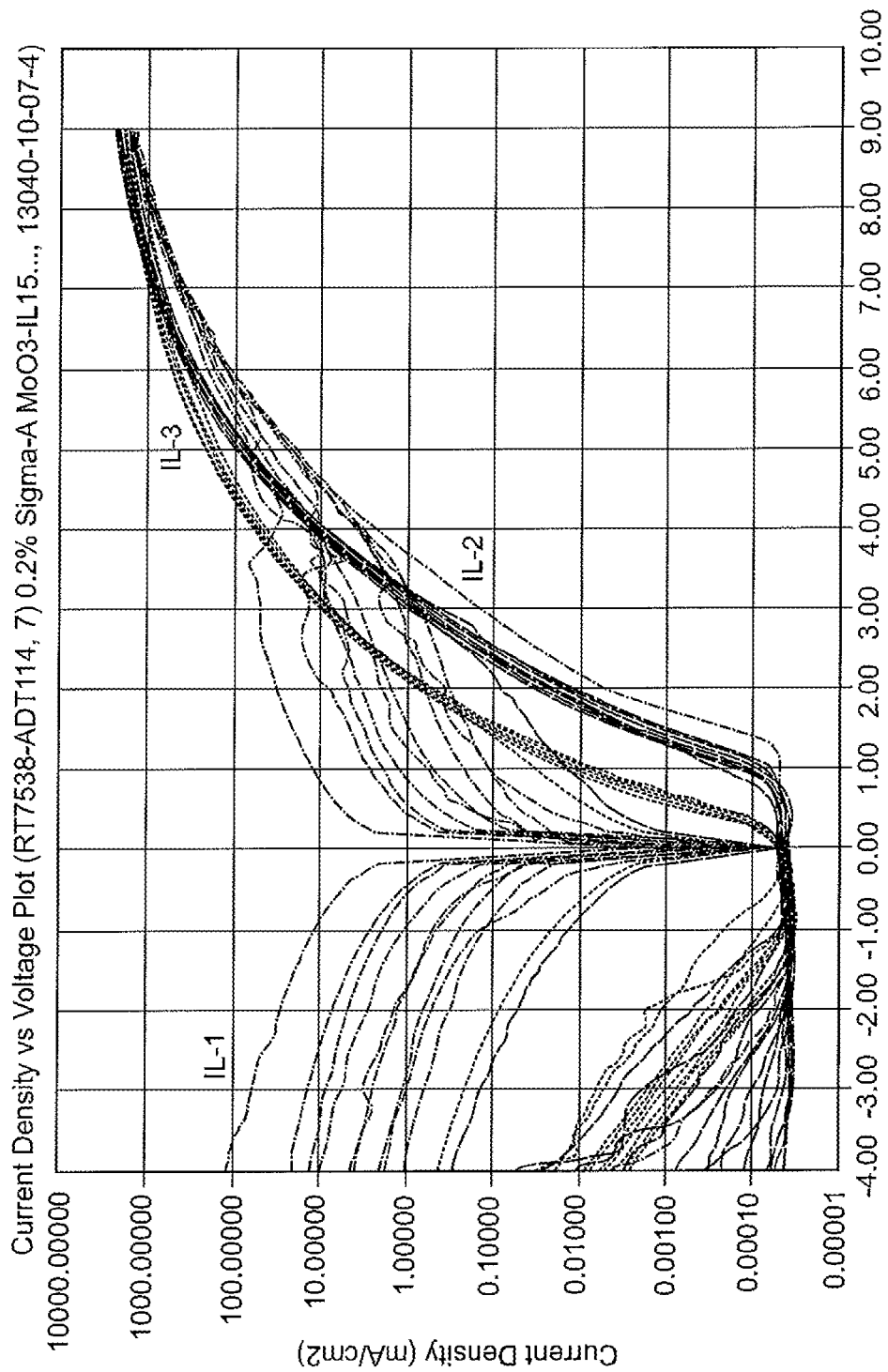
FIG. 3 shows I-V characteristics for a variety of devices comprising solution-deposited molybdic acid as a precursor and different inter-layers.

Solution-deposited molybdic acid resulted in efficient hole injection into Interlayer 3 and Interlayer 2, as can be seen from FIG. 3

However, all pixels with molybdic acid in combination with Interlayer 1 were shorted at voltages below 4V.

Conclusion

Aqueous solutions of molybdic acid are a less potent dopant than aqueous solutions of molybdenum trioxide. They do not result in doping of Interlayer 1 (IP=5.8 eV), but they do dope the hole transport layer (inter-layer) polymers with shallower HOMO levels The acceptor strength of solution-processed $MoO_3$ can be tuned by adjusting the pH of the precursor solution. Increasing the pH of the precursor solution reduces the oxidation potential.

Figure 4:
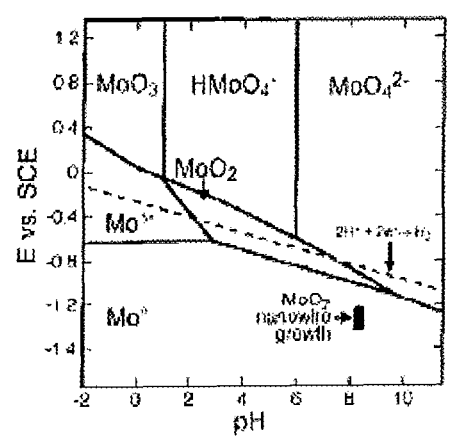
FIG. 4 is the potential—pH diagram for molybdenum oxide.

Background Information (1) The observation that the acceptor strength of solution-deposited $MoO_3$ is pH dependent is in agreement with the Potential—pH diagram (Pourbaix diagram) for molybdenum oxides below shown in FIG. 4 (see Chem. Mater., 2002, Vol. 14, No. 7, 3206-3216).

(2) The pH value of the precursor solutions used for the exemplifications above were measured and found to be in agreement with the assumption that the acceptor strength of $MoO_3$ is pH dependent:

| Precursor material | pH of 0.2% (w/w) aq. solution after filtration | Does dope the following: | Does not dope the following: |
|---|---|---|---|
| Phosphomolybdic acid | 1.0 | Interlayer 3 (IP = 5.2 eV) PVK (IP = 5.8 eV) | Polymer 1 (IP = 5.9 eV) |
| $MoO_3$ | 1.5-2.0 | Interlayer 3 (IP = 5.2 eV) Interlayer 2 (IP = 5.6 eV) Interlayer 1 (IP = 5.8 eV) | Polymer 1 (IP = 5.9 eV) |
| Molybdic Acid (predominantly ammonium salt, i.e. partly pH-neutralised) | 4.0 | Interlayer 3 (IP = 5.2 eV) Interlayer 2 (IP = 5.6 eV) | Interlayer 1 (IP = 5.8 eV) Polymer 1 (IP = 5.9 eV) |

Conclusions:

The acceptor strength of solution-processed $MoO_3$ can be controlled by adjusting the pH of the $MoO_3$ precursor solution Formulations with low pH enable the doping of—and hole injection into—deep-HOMO conjugated materials Formulations with partly neutralised Molybdic Acid (increased pH) enable tuning of the acceptor strength of the $MoO_3$ deposit and control of the doping profile in adjacent hole transport layers (inter-layers).

This is relevant for optimising the luminance efficiency in OLED applications—as illustrated in the Example 5 below.

EXAMPLE 5

Optimisation of the Luminance Efficiency in OLED Pixels with Solution-Deposited $MoO_3$ It is our understanding that thermal annealing may result in doping of the interface between solution-deposited $MoO_3$ and the adjacent hole transport layer (inter-layer) material.

Furthermore, depending on both the $MoO_3$ precursor and the hole transport layer (inter-layer) material, annealing may even result in the diffusion of dopants into the bulk of the hole transport layer (inter-layer) polymer, and the formation of a doping profile that extends from the $MoO_3$—hole transport layer (inter-layer) interface into the bulk of the hole transport layer (inter-layer).

In the following experiments, we conducted tests to determine the impact on the luminance efficiencies (external quantum efficiencies—EQE) of OLED pixels caused by (a) the thickness of the hole transport layer (inter-layer) polymer and (b) the choice of $MoO_3$ precursor material.

(a) EQE in OLEDs with Solution-Processed $MoO_3$ as a Function of Interlayer 3 Thickness A device was fabricated using the general procedure described in Examples 1 and 2 using an aqueous solution of molybdic acid (see Example 4) as the precursor solution for the molybdenum trioxide hole injection layer. After the hole transport layer (inter-layer) Interlayer 3 had been spin-coated onto the substrate (different thicknesses, as given below) in different devices, the substrate was annealed. A 70 nm layer of the light emitting polymer LEP 1 was spin coated onto the annealed hole transport layer and dried, and then finally a tri-layer sodium fluoride-aluminium-silver cathode was thermally evaporated onto the light emitting polymer to complete the OLED. Typically, the cathode is deposited by thermal evaporation of, for Example 2 nm of NaF, 200 nm Al and 100 nm of Ag in successive steps.

Device Geometry: Bipolar devices with [ITO/solution-deposited Molybdic Acid/x Interlayer 3/70 nm LEP 1/2 nm NaF—200 nm Al—100 nm Ag], with IL thickness x=22 nm, 40 nm, 60 nm, and 80 nm.

Control devices with a polymeric HIL similar to PEDOT:PSS obtainable from Plextronics, Inc., 2180 William Pitt Way, Pittsburgh, Pa. 15238, USA instead of solution-deposited $MoO_3$ were also manufactured, having the following geometry:

[ITO/35 nm Polymeric HIL obtained from Plextronics/22 nm Interlayer 3/70 nm LEP 1/2 nm NaF—Al—Ag]

The Interlayer 3 layer was deposited from an ortho-xylene layer, which does not dissolve the Polymeric HIL. Before spin-coating the LEP 1, the Interlayer 3 needs to be thermally crosslinked. For this purpose, Interlayer 3 contains BCB units attached to the polymer chain. These BCB units are thermally activated and result in crosslinking and insolubilisation of the polymer after annealing at 200° C. for 15 minutes.

Figure 5:
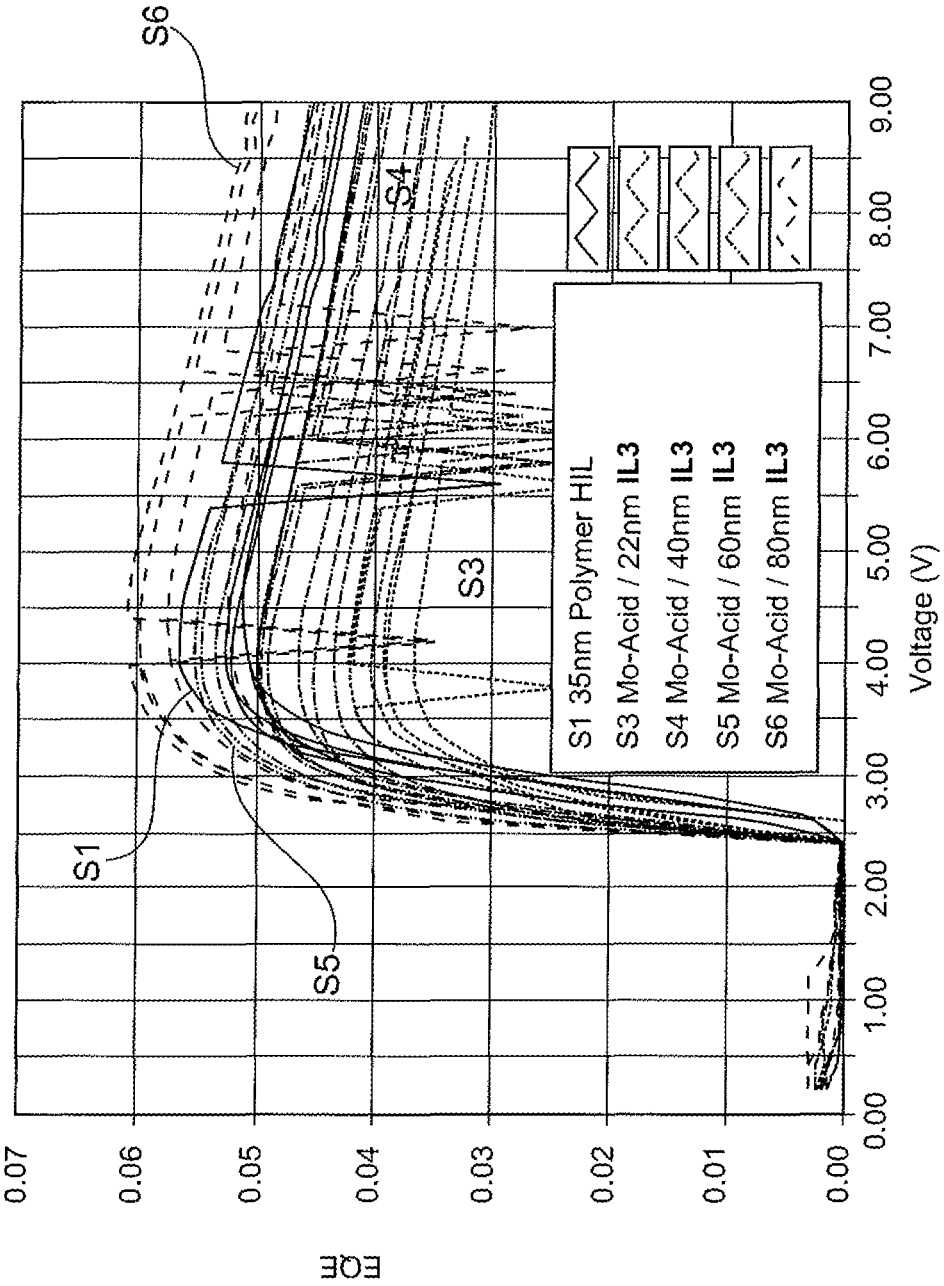
FIG. 5 shows a plot of External Quantum Efficiency against voltage for OLED pixels comprising solution-deposited molybdic acid as a precursor, different thicknesses of the same hole transporting "inter-layer" and the same LEP.

Results:
As can be seen from FIG. 5, increasing the thickness of the Interlayer 3 hole transport layer results in higher EQE values The EQE for solution-processed $MoO_3$ in combination with 60 nm of Interlayer 3 matches the EQE of the control devices with the Polymeric HIL and 22 nm of Interlayer 3.

Conclusion:
Increasing the hole transport layer (inter-layer) thickness in OLED pixels with $MoO_3$-based HILs improves the luminance efficiency.

(b) Improving the Efficiency of OLED Pixels by Using Molybdic Acid Instead of $MoO_3$ as Precursor Material in Combination with Interlayer 3

OLED devices were fabricated using the same procedure as in Example 5(a), with a 60 nm layer of the hole transport layer Interlayer 3. One device had a hole injection layer consisting of molybdenum trioxide deposited from an aqueous solution of molybdenum trioxide as a precursor whereas the other device had a hole injection layer consisting of molybdenum trioxide deposited from an aqueous solution of molybdic acid Device Geometry: Bipolar devices with [ITO/solution-deposited $MoO_3$ or Molybdic Acid/60 nm Interlayer 3/70 nm LEP 1/2 nm NaF—Al—Ag]

Control devices with a polymeric HIL instead of solution-deposited $MoO_3$ were also manufactured, having the following geometry:

[ITO/35 nm Polymeric HIL obtained from Plextronics/22 nm Interlayer 3/70 nm LEP 1/2 nm NaF—Al—Ag].

Figure 6:
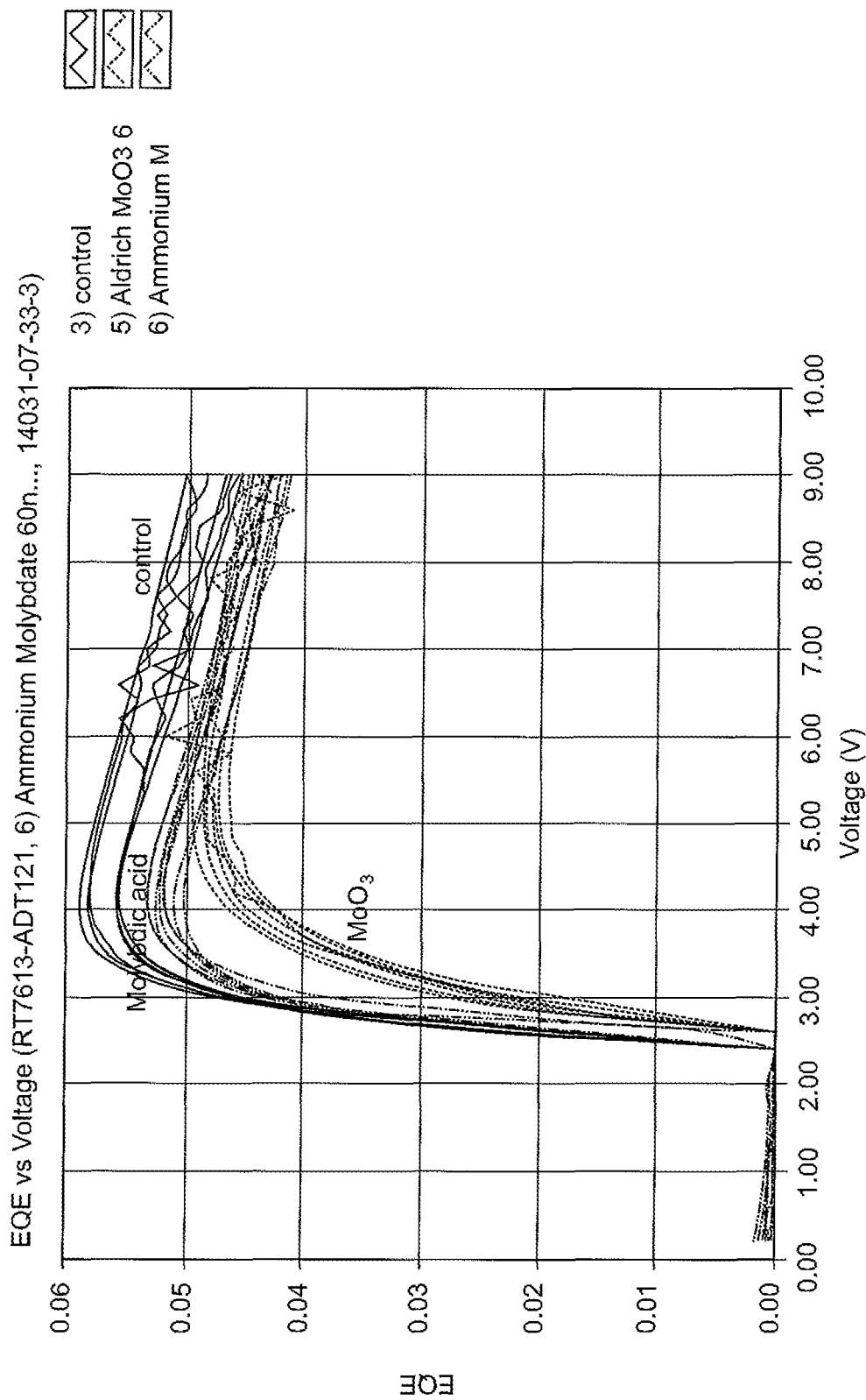
FIG. 6 shows a plot of External Quantum Efficiency against voltage for a variety of devices comprising solution-deposited $MoO_3$ or molybdic acid as a precursor, the same hole transporting "inter-layer" and the same LEP.

The results, showing a plot of EQE against voltage for the different devices are shown in FIG. 6.

Result:
It was found that for identical device geometries, molybdenum trioxide deposited from a solution of molydbic acid resulted in a higher luminance efficiency (EQE) than molybdenum trioxide deposited from a solution of molybdenum trioxide.

Conclusion:
In composite HILs with the shallow-HOMO hole transport layer (inter-layer) Interlayer 3, the weaker acceptor compound molybdic acid as a precursor resulted in higher OLED luminance efficiencies than the stronger acceptor compound $MoO_3$ as a precursor.

Based on these findings, the present invention discloses two strategies to maximise the luminance efficiency in OLEDs with HILs comprising solution-deposited $MoO_3$:
(1) Increasing the thickness of the hole transport layer, and
(2) Reducing the acceptor strength of the $MoO_3$ precursor.

The invention claimed is:
1. A process for the adjustment of the electron acceptor strength of a transition metal oxide to the HOMO (highest occupied molecular orbital) energy level of a semiconducting hole transport layer material in a device comprising an anode, a layer of said transition metal oxide deposited on said anode and a layer of said semiconducting hole transport layer material deposited on said transition metal oxide layer, said process comprising:
(a) depositing a solution comprising a precursor for said transition metal oxide on said anode, wherein the precursor solution is selected so that the electron acceptor strength of the transition metal oxide for which the solution is a precursor is adjusted relative to the HOMO level of said semiconducting hole transport layer material;
(b) drying the deposited solution to form a solid layer precursor layer;
(c) depositing a solution of said semiconducting hole transport layer material onto said solid layer precursor layer; and
(d) annealing thermally the product of step (c) to produce a device having transition metal oxide at the interface between said anode and said semiconducting hole transport layer.

2. A process according to claim 1, further comprising optimizing the electron acceptor strength of the transition metal oxide for which the solution is a precursor relative to the HOMO of said semiconducting hole transport layer material.

3. A process according to claim 1, further comprising adjusting the electron acceptor strength of the transition metal oxide relative to the HOMO of the semiconducting hole transport layer material to be deposited thereon by adjusting the pH of the solution of the precursor for said transition metal oxide.

4. A process according to claim 3, wherein the pH of the precursor solution is selected or adjusted to have a value lying in the range from 1 to 7.

5. A process according to claim 3, wherein the pH of the precursor solution is selected or adjusted to have a value lying in the range from 3 to 6.

6. A process according to claim 3, wherein the pH of the precursor solution is selected or adjusted to have a value lying in the range from 1 to 2.

7. A process according to claim 1, wherein said transition metal oxide is an oxide of molybdenum, tungsten or vanadium.

8. A process according to claim 1, wherein said transition metal oxide is selected from molybdenum trioxide, tungsten trioxide and vanadium pentoxide.

9. A process according to claim 8, wherein said precursor solution is a precursor solution for molybdenum trioxide comprising a dispersion or a dissolution of molybdenum trioxide, ammonium molybdate, phosphomolybdic acid or molybdic acid in water, wherein the molybdic acid is partially neutralized with $NH_4OH$.

10. A process according to claim 9, wherein said precursor solution is a dissolution of molybdenum trioxide in water at a pH of from 1 to 2.5.

11. A process according to claim 8, wherein said precursor solution is a dispersion or a dissolution of phosphomolybdic acid in a polar organic solvent.

12. A process according to claim 1, comprising the following further steps:
(a) depositing a solution of a second semiconducting hole transport layer material onto the first semiconducting hole transport layer material, said second semiconducting hole transport layer material having a deeper HOMO level than said first semiconducting hole transport layer material; and
(b) annealing thermally the product of step (a) to produce a device having transition metal oxide at the interface between said anode and the first semiconducting hole transport layer, and a second semiconducting hole transport layer material having a deeper HOMO level than said first semiconducting hole transport layer material stacked on said first semiconducting hole transport layer material.

13. A process according to claim 1, comprising the following further steps:
(a) depositing a solution of a second semiconducting hole transport layer material onto the first semiconducting hole transport layer material, said second semiconducting hole transport layer material being the same as said first semiconducting hole transport layer material; and
(b) annealing thermally the product of step (a) to produce a having transition metal oxide at the interface between said anode and the first semiconducting hole transport layer, and a second semiconducting hole transport layer material that is the same as the first semiconducting hole transport layer material stacked on said first semiconducting hole transport layer material.

14. A process according to claim 1, comprising the following further steps:
(a) depositing a solution of a second semiconducting hole transport layer material onto the first semiconducting hole transport layer material, said second semiconducting hole transport layer material being different to said first semiconducting hole transport layer material but having a similar HOMO level to that of said first semiconducting hole transport layer material; and
(b) annealing thermally the product of step (a) to produce a device having transition metal oxide at the interface between said anode and the first semiconducting hole transport layer, and a second semiconducting hole transport layer material having a similar HOMO level to that of said first semiconducting hole transport layer material stacked on said first semiconducting hole transport layer material.

15. A process according to claim 1, for the production of an organic light emitting device, said process comprising the following further steps:
(a) depositing a solution of a light emitting polymer on the top layer of semiconducting hole transport material;
(b) drying said layer of light emitting polymer to give a light emitting polymer layer; and
(c) thermally evaporating a low work function metal onto the light emitting polymer layer formed in step (b) to form a cathode, thereby producing the organic light emitting device.

16. A process according to claim 15, wherein said light emitting polymer is formed from the following monomers:

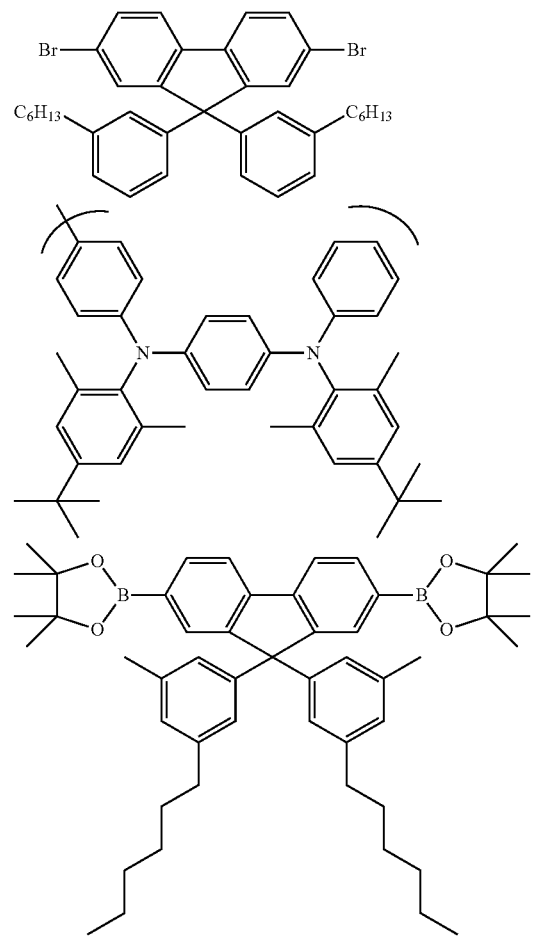

-continued

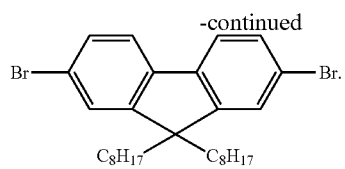

17. A process according to claim 15, wherein the low work function metal that forms the cathode is a bi-layer or tri-layer structure of metals or compounds selected from the group consisting of sodium fluoride, aluminum, calcium and silver.

18. A process according to claim 15, further comprising optimizing the external quantum efficiency of the organic light emitting device by varying the thickness of the semiconducting hole transport layer.

19. A process according to claim 18, further comprising optimizing the external quantum efficiency of the organic light emitting device by increasing the thickness of the semiconducting hole transport layer.

20. A process according to claim 1, further comprising optimizing the external quantum efficiency of the organic light emitting device by adjusting the acceptor strength of the transition metal oxide precursor.

21. A process according to claim 20, further comprising optimizing the external quantum efficiency of the organic light emitting device by reducing the acceptor strength of the transition metal oxide precursor.

22. A process according to claim 21, wherein reducing the acceptor strength of the transition metal oxide precursor is carried out by increasing the pH of the precursor solution.

* * * * *